(12) United States Patent
Jung et al.

(10) Patent No.: US 11,270,762 B1
(45) Date of Patent: Mar. 8, 2022

(54) SRAM WITH ADVANCED BURST MODE ADDRESS COMPARATOR

(71) Applicant: QUALCOMM Incorporated, San Diego, CA (US)

(72) Inventors: Changho Jung, San Diego, CA (US); Arun Babu Pallerla, San Diego, CA (US); Percy Dadabhoy, Austin, TX (US)

(73) Assignee: Qualcomm Incorporated, San Diego, CA (US)

( * ) Notice: Subject to any disclaimer, the term of this patent is extended or adjusted under 35 U.S.C. 154(b) by 17 days.

(21) Appl. No.: 17/008,433

(22) Filed: Aug. 31, 2020

(51) Int. Cl.
| | | |
|---|---|---|
| *G11C 11/418* | (2006.01) | |
| *G11C 11/419* | (2006.01) | |
| *G11C 7/10* | (2006.01) | |
| *G11C 7/06* | (2006.01) | |
| *H04M 1/2745* | (2020.01) | |
| *G11C 11/412* | (2006.01) | |

(52) U.S. Cl.
CPC .......... *G11C 11/418* (2013.01); *G11C 11/412* (2013.01); *G11C 11/419* (2013.01); *H04M 1/2745* (2013.01); *H04M 2201/36* (2013.01)

(58) Field of Classification Search
CPC ... G11C 11/418; G11C 11/412; G11C 11/419; G11C 7/106; G11C 7/065; G11C 7/08
USPC ......................................... 365/154, 190, 207
See application file for complete search history.

(56) References Cited

U.S. PATENT DOCUMENTS 10,770,132 B1 * 9/2020 Jung ...................... G11C 11/419
2020/0388328 A1 * 12/2020 Jung ...................... G11C 11/419

* cited by examiner

*Primary Examiner* — Ly D Pham
(74) *Attorney, Agent, or Firm* — Qualcomm Incorporated

(57) ABSTRACT

A memory is provided that is configured to practice both a normal read operation and also a burst mode read operation. A burst mode address comparator compares a current row address to a preceding row address from a preceding read operation to determine whether a read operation is a normal read operation or a burst mode read operation. The burst mode address comparator invokes the burst mode despite the presence of an intervening write operation to a row address not equal to the preceding row address.

22 Claims, 6 Drawing Sheets

SRAM WITH ADVANCED BURST MODE ADDRESS COMPARATOR

TECHNICAL FIELD

This application relates to memories, and more particularly to a low-power memory with a burst mode address comparator.

BACKGROUND

In a conventional static random-access memory (SRAM), a bit line voltage difference during a read operation is not full rail but instead equals a fraction of the power supply voltage. For example, if the power supply voltage is one volt, the voltage difference may be just 100 millivolts or less. To respond to this relatively small voltage difference and make a bit decision as to what was stored in the bitcell, a typical sense amplifier requires a relatively large amount of gain and thus does not fit within the column pitch such that each sense amplifier is multiplexed across a multiplexed group of columns. A burst mode read operation is thus not available for SRAMs with sense amplifier multiplexing.

Accordingly, there is a need in the art for SRAMs with a burst mode read operation.

SUMMARY

In accordance with a first aspect of the disclosure, a burst mode address comparator for a memory is provided that includes: a latch configured to set a latch output signal responsive to a second row address for a write operation following the first read operation being equal to the first row address; a first plurality of logic gates configured to assert a bit comparison word responsive to a current row address for the memory being equal to the first row address; a first transistor configured to switch off during each write operation and to switch on during each read operation; a second transistor having a first terminal coupled to a burst mode node for a burst mode signal and having a second terminal coupled to ground through the first transistor; and a second plurality of logic gates configured to switch on the second transistor to ground the burst mode node responsive to an assertion of the bit comparison word while the latch output signal is asserted and to not switch on the second transistor responsive to an assertion of the bit comparison word while the latch output signal is reset.

In accordance with a second aspect of the disclosure, a burst-mode method for a memory is provided that includes: pre-charging a pair of sense nodes for a sense amplifier during a first read operation to a first row in the memory; latching a first bit signal in the sense amplifier after the pre-charging; in a write operation after the first read operation, writing to a second row in the memory; and in a second read operation to the first row following the write operation, transferring the first bit signal latched in the sense amplifier to a data output latch without pre-charging the pair of sense nodes during the second read operation and without asserting a word line for the first row during the second read operation.

In accordance with a third aspect of the disclosure, a memory is disclosed that includes: a word line; a plurality of columns, each column in the plurality of columns including a bitcell at an intersection of the column with the word line, a pair of bit lines, and a sense amplifier coupled to the pair of bit lines through a pair of sense nodes; a burst mode blocking latch configured to set a latch output signal responsive to a write operation to a first row address after an initial read operation to the first row address; a burst mode address comparator configured to determine for a series of subsequent read operations following the initial read operation whether each subsequent read operation is a burst mode read operation or a random read operation responsive to a row address for each subsequent read cycle and responsive to the latch output signal; and a sense node pre-charge circuit configured to pre-charge each column's pair of sense nodes in each random read operation and to not pre-charge each column's pair of sense nodes in each burst mode read operation.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
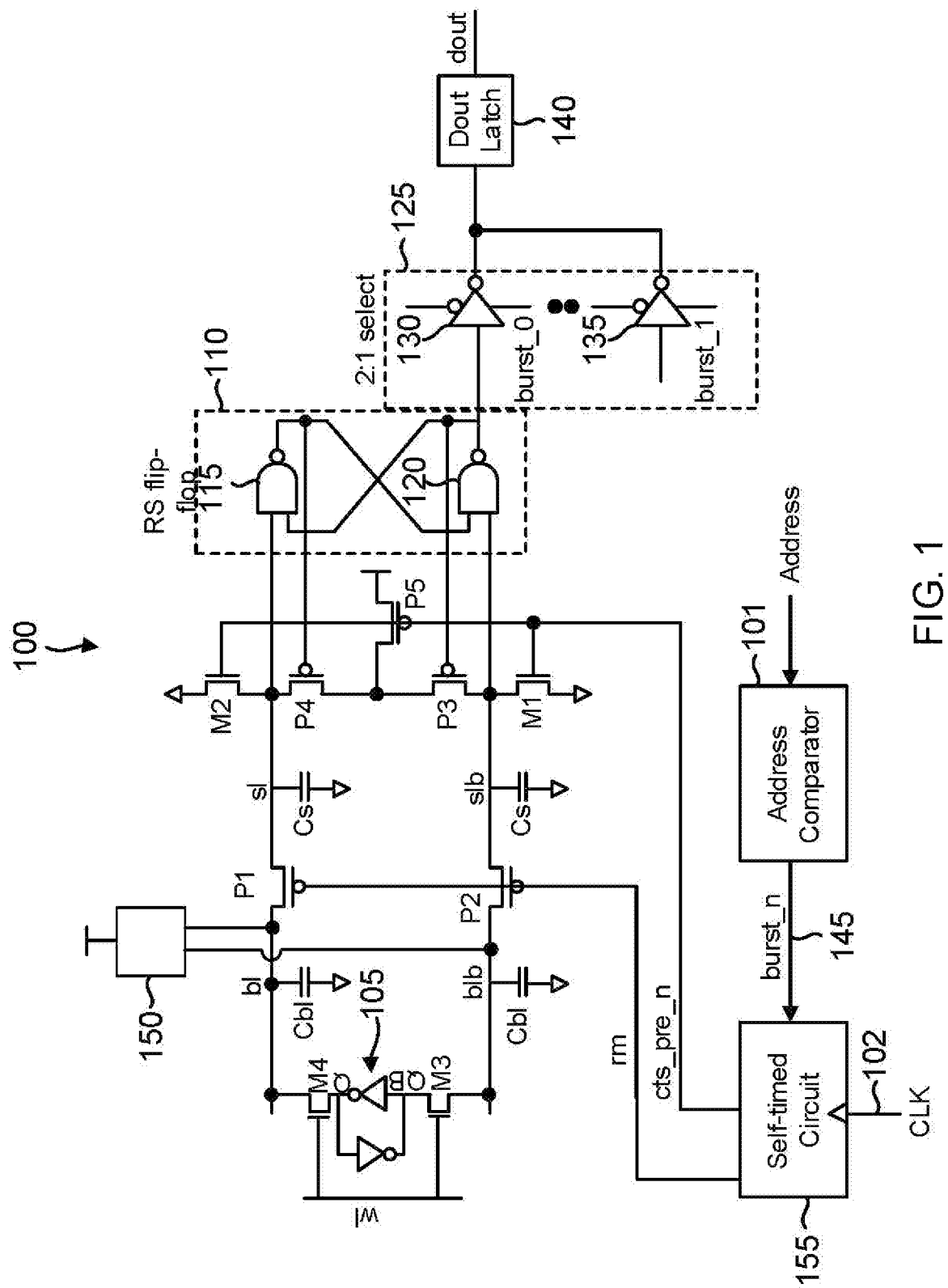
FIG. 1 illustrates an SRAM including a burst mode address comparator for invoking a burst mode of operation despite a presence of intervening write operations in accordance with an aspect of the disclosure.

A memory such as an SRAM is provided with a plurality of bitcells arranged according to rows and columns. Each column has a corresponding pair of bit lines. Each row has a corresponding word line. At each row and column intersection, there is a corresponding one of the bitcells. Each column includes its own sense amplifier that latches a bit decision during a random read operation to one of its bitcells. In a random read operation, the word line to the accessed row is asserted such that each column's sense amplifier latches a bit decision from the column's bitcell that is shared with the accessed row.

An address comparator controls whether each read operation occurs as a random read operation or a burst mode read operation. In either type of read operation, the accessed row is identified by a unique row address. The burst mode follows a random read operation to a row having a first row address. The address comparator invokes the burst mode in a subsequent read operation directed to the same row address so long as no intervening write operations were directed to the same row address. The address comparator will thus still invoke the burst mode even if intervening write operations occur to other rows.

The resulting burst mode is also denoted herein as an advanced burst mode read operation as the latched bit decision in the sense amplifiers are not discarded despite the presence of intervening write operations to the other row(s). This is quite advantageous in conserving power as the word line to the accessed row during the burst mode read operation is not asserted. Similarly, the sense amplifier is not pre-charged during the burst mode read operation to further conserve power The following discussion will be directed to an advantageous charge-transfer implementation that simplifies the sense amplifier implementation. However, it will be appreciated that any conventional latching sense amplifier may be used so long as each column has its own sense amplifier. As discussed previously, a bit line voltage difference for a column's bit line pair during a read operation (either random or burst mode) is not full rail but instead equals a fraction of the power supply voltage. A conventional SRAM sense amplifier thus requires gain to amplify this partial bit line voltage difference into a "full rail" bit decision that either equals the power supply voltage or ground. A conventional SRAM sense amplifier is thus relatively bulky such that the column pitch would have to be correspondingly large to accommodate each column having its own conventional SRAM sense amplifier. The charge-transfer disclosed herein enables each column to have a compact sense amplifier such as a reset-set flip-flop implemented by a pair of cross-coupled logic gates (for example, a pair of cross-coupled NAND gates).

Prior to a random read operation, the bit line pairs for the columns are pre-charged to a memory power supply voltage. A clock signal then triggers a self-timed clock circuit to assert a word line for an addressed one of the rows. The asserted word line switches on the access transistors in the row's bitcells so that the bitcells in the addressed row can affect the pre-charged state of the corresponding bit line pairs. Depending upon the binary content of the addressed bitcells, one of the bit lines in each bit line pair will be discharged slightly below the memory power supply voltage while a second bit line in each bit line pair remains charged to the memory power supply voltage.

Each column has its own sense amplifier that latches a bit decision based upon the voltage difference developed across the column's bit line pair when the word line voltage is asserted. The bit decisions from the sense amplifiers/columns may be arranged into groups of multiplexed columns. The bitcells at the intersection of a word line with the group of multiplexed columns are denoted herein as a bitcell group such that only the column address differs across the bitcell group. Each group of multiplexed columns includes a column multiplexer that selects from the group's sense amplifiers to drive a corresponding data output latch. The selection by the column multiplexer depends upon the column address. Each sense amplifier includes a pair of sense amplifier nodes for coupling to the column's bit lines during a sense enable period in a random read operation. The sense amplifier nodes are precharged prior to the random read operation although this pre-charging may be a discharge to ground as compared to the pre-charging of the bit lines to the power supply voltage. The random read operation ends with the bit decision from the addressed column being latched in the data output latch.

Whether a consecutive read operation is another random read operation or a burst mode read operation depends in part upon whether the address for the consecutive read operation is directed to the same row. Note that during the random read operation, each sense amplifier in the addressed group of multiplexed columns latched a bit decision for the bitcell group. A burst mode address comparator disclosed herein advantageously invokes the burst mode for the consecutive read operation if the same row is addressed as was addressed in the preceding read operation so long as no intervening write operations occur to the same row. In this fashion, the latched bit decisions from the preceding random read operation are utilized in the burst mode read operation without requiring the word line to be re-asserted and despite a presence of write operations to other rows. Similarly, the bit lines are not pre-charged nor are the sense amplifier nodes pre-charged during a burst mode read operation so as to reduce power consumption.

Prior to the burst mode address comparator invoking the burst mode, a random read operation should occur so that the sense amplifiers latch their bit decisions. Once the random read operation occurs, the burst mode may be invoked again and again so long as the same row is being addressed as was addressed in the preceding random read operation (assuming that there is no intervening write to this row). For example, suppose that that four columns are multiplexed and that an initial random read operation occurs to a first column from the four columns. If a consecutive read operation is directed to the same row without any intervening write operation to the same row, the address comparator activates the burst mode. For example, a second column from the four columns may be read in a first burst mode read operation. A third column from the four columns may then be read in a second burst mode read operation, and so on. The word line, the bit lines, and the sense amplifier nodes are not precharged during the burst mode read operations, which substantially reduces power consumption.

In general, the column address is typically smaller than the row address as the column multiplexing is generally smaller than the number of rows. For example, just two address bits are necessary to identify the addressed column for an embodiment with 4:1 column multiplexing. In contrast, the row address would be seven bits to identify the addressed row in an embodiment with 128 rows. The following discussion will thus assume that the row address bits are the most-significant bits in the read address whereas the column address bits are the least-significant bits. In such an embodiment, the burst mode address comparator thus functions to determine whether the most significant bits of the read address for a current read operation are equal to the most significant bits for the read address in the preceding random read operation. More generally, the burst mode address comparator functions to determine whether the row address portion of the current read address equals the row address portion of the preceding random read address. If the row addresses are equal, the burst mode address comparator invokes the burst mode for the current read cycle. If the row addresses are not equal, the burst mode address comparator does not invoke the burst mode for the current read cycle.

The following discussion will be directed to advantageous charge-transfer embodiments for the burst mode memory that is controlled by the burst mode address comparison disclosed herein. However, it will be appreciated that the burst mode address comparison disclosed herein is applicable to any SRAM in which each column includes a latching sense amplifier. In a charge-transfer memory implementation, density is not hindered by a lack of multiplexing a single sense amplifier across multiple columns because of a charge-transfer operation that is achieved through the control of charge-transfer transistors. Each bit line for a column couples to a sense amplifier node for the column's sense amplifier through a corresponding charge-transfer transistor. A source of each charge-transfer transistor couples to its bit line whereas a drain of each charge-transfer transistor couples to its sense amplifier node. The gate-to-source voltage for each charge-transfer transistor is thus determined by its gate voltage and its bit line voltage. The following discussion will assume that each charge-transfer transistor is a p-type metal-oxide semiconductor (PMOS) transistor but it will be appreciated that charge transfer may also be accomplished with n-type metal-oxide semiconductor (NMOS) transistors.

Prior to the word line assertion for the initial random read operation, the bit lines are pre-charged to a power supply voltage whereas the sense amplifier nodes are all discharged. The word line is then asserted for a word line assertion period during which a bit line voltage difference develops for each bit line pair that depends upon the bit stored in each bitcell at the intersections of the word line and the bit line pairs for the group of multiplexed columns. Depending upon this bit, either a true bit line or a complement bit line in each bit line pair is discharged slightly from the pre-charged state (the power supply voltage). The resulting bit line voltage difference is not full rail but instead is just a fraction of the power supply voltage (e.g., approximately 100 mv). To form a bit decision from such a relatively small bit line difference traditionally requires a high-gain sense amplifier. Such a high-gain sense amplifier requires substantial die space so that it would typically be multiplexed across a group of columns. But the charge-transfer technique discussed herein results in an amplification of the bit line voltage difference across the pair of sense nodes for a bit line pair. Due to this amplification, a resulting sense amplifier does not need high gain but instead may be implemented by a reset-set (RS) latch that is relatively dense and has a relatively low power consumption. Each column may thus have its own sense amplifier.

The charge transfer occurs during a charge-transfer period that begins near an end of the word line assertion period. Prior to the charge-transfer period, the gate voltage for each charge-transfer transistor is maintained at the power supply voltage so that each charge-transfer transistor is off. The charge-transfer period is delayed with respect to the assertion of the word line so that the bit line voltage difference may develop for each bit line pair. During the charge-transfer period, the gate voltage for the charge-transfer transistors is dropped from the power supply voltage at some slew rate towards ground. For example, a relatively small inverter or the dummy bit line voltage may be used to control the gate voltage for the charge-transfer transistors. Depending upon the bit value being read, either the true bit line or the complement bit line in each bit line pair will drop slightly from its pre-charged state (the power supply voltage). This bit line is referred to in the following discussion as the partially-charged bit line. But the remaining bit line in each bit line pair will remain charged to the power supply voltage. This bit line is referred to as the fully-charged bit line in the following discussion.

The gate voltage for each charge-transfer transistor in the group of multiplexed columns is dropped during the charge-transfer period so that the gate-to-source voltage (the gate-to-bit-line voltage) for the charge-transfer transistor for the fully-charged bit line satisfies its threshold voltage. But the reduction in voltage for the partially-charged bit line is such that this same gate voltage does not satisfy the threshold voltage for the charge-transfer transistor for the partially-charged bit line. Thus, only the charge-transfer transistor for the fully-charged bit line in a bit line pair will initially conduct charge to its sense node. The capacitance of the sense node may be relatively small compared to the capacitance of the bit line so the resulting charge transfer cause the sense node to be nearly charged to the power supply voltage. In contrast, the sense node for the partially-discharged bit line remains in its discharged default state such that the voltage difference between the sense nodes for an accessed bit line pair is nearly full rail (a voltage difference nearly equaling the power supply voltage). The charge transfer has thus resulted in an amplification of the relatively minor bit line voltage difference into a nearly-full-rail voltage difference on the sense nodes such that the sense amplifier may be a relatively compact and low-power RS latch such as formed by a pair of cross-coupled NAND gates. The sensing by the sense amplifier occurs in a sense enable period An example charge-transfer SRAM 100 is shown in FIG. 1 that includes a burst mode address comparator 101 that advantageously invokes the burst mode despite the presence of intervening read operations to different rows. A bit line pair of a bit line bl and a complement bit line blb traverse a first column. A bitcell 105 lies at an intersection of the first column and a word line wl. Bitcell 105 is formed by a pair of cross-coupled inverters. The output node of a first one of the inverters is the true (Q) output for bitcell 105. This output node couples to the bit line bl through an NMOS access transistor M4. Similarly, the output node of a remaining second one of the inverters is the complement (QB) output for bitcell 105 that couples to the complement bit line blb through an NMOS access transistor M3. The word line wl couples to the gates of the access transistors so that the Q and QB nodes drive their respective bit lines during a word line assertion period.

SRAM 100 includes a second column having a bitcell at its intersection with word line wl. Since the second column is a repeat of the structure in the first column, the details for the second column are not shown in FIG. 1 for illustration clarity. The two columns are multiplexed through a column multiplexer 125. Should the read operation (whether random or burst mode) be directed to bitcell 105, column multiplexer 125 selects for a sense amplifier output from a sense amplifier 110 for the first column. For example, column multiplexer 125 may include a tri-state buffer 130 for the first column and a tri-state buffer 135 for the second column. The tri-state buffer for the un-selected column is tri-stated to form the selection in column multiplexer 125. The output of column multiplexer 125 is latched in a data output latch 140.

Bitcell 105 for the first column and the corresponding bitcell in the second column form a bitcell group that share a common address that identifies word line wl and the group of multiplexed columns. Only the column address changes within the bitcell group. Regardless of whether a read operation occurs with or without the burst mode, each read operation is responsive to a cycle of a memory clock signal 102. Suppose that a first memory clock cycle corresponds to a read operation involving a different word line and/or column and that this first memory clock cycle is followed by a second memory clock cycle in which a read operation is directed to bitcell 105. For this second read operation, burst mode address comparator 101 does not activate the burst mode since the previous address decoded in the first memory clock cycle identified a different word line and/or a different group of multiplexed columns.

Prior to the word line assertion during a random read operation, bit lines bl and blb were pre-charged to the power supply voltage by a bit line pre-charge circuit 150. Such pre-charging of the bit lines is conventional and thus the details for bit line pre-charge circuit 150 are not illustrated in FIG. 1. The timing of various actions such as the pre-charging of the bit lines, the pulse width for the word line assertion, and the enabling of sense amplifier 110 during a read operation is controlled by a self-timed clock circuit 155 as triggered by memory clock signal 102. The timing of these actions during a normal read operation is conventional. However, self-timed clock circuit 155 is modified from such conventional function to accommodate the burst mode. Self-timed clock circuit 155 is thus responsive to a burst mode signal such as an active-low burst mode signal 145 (burst n) so that the word line is not asserted, the bit lines are not pre-charged, and the charge-transfer transistors are not switched on during a burst mode operation.

To control whether the burst mode is active, burst mode address comparator 101 asserts or de-asserts burst mode signal 145. As used herein, a signal is said to be "asserted" (or equivalently "set") when the signal has a logical true state, regardless of whether the logical true state is active high or active low. Conversely, a signal is deemed herein to be "reset" when the signal has a logical false state, regardless of whether the logic true state is active high or active low. In alternative embodiments, the burst mode signal may instead be an active high signal. Should burst mode address comparator 101 not assert burst mode signal 145, SRAM 100 implements a random read operation in which the second memory clock cycle triggers a charging of the voltage for word line wl by self-timed clock circuit 155. Prior to this word line assertion, bit lines bl and blb were pre-charged to the power supply voltage by bit line pre-charge circuit 150. Following the bit line pre-charging, bit line pre-charge circuit 150 floats the bit lines. Bit line bl couples to a corresponding sense node sl for sense amplifier 110 through a PMOS charge-transfer transistor P1. Similarly, complement bit line blb couples a to a corresponding sense node slb through a PMOS charge-transfer transistor P2. Prior to the word line assertion, a gate voltage rm for the charge-transfer transistors is charged to the power supply voltage by self-timed clock circuit 155 to prevent any charge transfer to the sense nodes. Since the burst mode is not active, self-timed clock circuit 155 charges a sense node pre-charge signal (cts_pre_n) to a power supply voltage prior to the word line assertion. The charged sense node pre-charge signal drives the gates of an NMOS transistor M1 and an NMOS transistor M2. The sources of transistors M1 and M2 are tied to ground whereas their drains are tied to complement sense node slb and sense node sl, respectively. The assertion of the sense node pre-charge signal will thus discharge both the sense node sl and the sense node slb for the first column since both transistors M1 and M2 are switched on to couple their respective bit lines to ground. As noted earlier, the second column has the same structure as shown for the first column.

Both columns will thus have their sense nodes discharged and their bit lines pre-charged prior to the word line assertion for a normal read operation in which the burst mode is not active. But if a consecutive read operation is directed to the second column, burst mode address comparator 101 activates the burst mode by asserting burst mode signal 145. Self-timed clock circuit 155 responds to the assertion of burst mode signal 145 by preventing the assertion of the word line wl. Similarly, the gate voltage signal rm is maintained at a power supply voltage by self-timed clock circuit 155 during the burst mode to prevent the charge-transfer transistors P1 and P2 from conducting. In addition, self-timed clock circuit 155 maintains the sense amplifier precharge signal cts_pre_n at ground during the burst mode read operation to prevent the pre-charging of the sense nodes sl and slb.

During a random read operation, the switching on of the access transistors M4 and M3 by the assertion of the word line voltage causes one of the bit line bl or blb to discharge slightly from its pre-charged state depending upon the binary content stored in bitcell 105. This slight bit line discharge is amplified by the charge-transfer period during which charge-transfer transistors P1 and P2 are switched on as follows. The charge-transfer period is triggered by the discharge of gate voltage rm. This discharge of the gate voltage rm begins while the word line voltage is still asserted. The discharge of the gate voltage rm may end after the word line voltage has been discharged. The discharge of the gate voltage rm has some slope to it. Due to this less-than-instantaneous discharge of the gate voltage rm, the gate voltage rm will discharge to the threshold voltage for the charge-transfer transistor having its source tied to the fully-charged bit line but will still be above the threshold voltage for the charge-transfer transistor having its source tied to the partially-discharged bit line. The charge-transfer transistor for the fully-charged bit line will thus conduct charge to its sense node prior to when the other charge-transfer transistor conducts charge from the partially-discharged bit line. For example, suppose that bit line bl is the fully-charged bit line such that charge-transfer transistor P1 begins conducting before charge-transfer transistor P2. The sense node voltage sl will thus increase prior to the increase of the complement sense node voltage slb.

Sense node sl is connected to an input of a NAND gate 115 in sense amplifier 110. Similarly, sense node slb ties to an input of a NAND gate 120 in sense amplifier 110. NAND gates 115 and 120 are cross-coupled to form an RS latch. The pre-charging to zero volts of the sense nodes causes both outputs of NAND gates 115 and 120 to be asserted high to the power supply voltage. The output of NAND gate 120 also forms an output terminal for the first column. The corresponding NAND gate in the second column (not illustrated) forms an output terminal for the second column. The capacitance of the sense nodes as conceptually represented by capacitors Cs is relatively small as compared to the bit line capacitance as conceptually represented by capacitors Cbl. The brief amount of time in which charge-transfer transistor P1 begins conducting before charge-transfer transistor P2 conducts thus causes a significant increase in the voltage of sense node sl as compared to sense node slb. This increase in voltage exceeds the threshold voltage for NAND gate 115 such that its output is discharged to zero. The zero output of NAND gate 115 reinforces the binary high output of NAND gate 120 so that the binary one value stored in bitcell 105 is latched in sense amplifier 110.

If the read operation is to the first column, column multiplexer 125 selects for the output terminal of sense amplifier 110 in the first column so that the binary content of bitcell 105 is latched into data output latch 140 in the first memory cycle. But note that the sense amplifier for the second column has also latched the bit stored in the remaining bitcell in the bitcell group. This bit sensing will not be discarded if a consecutive read operation is directed to this remaining bitcell. Burst mode address comparator 101 detects that the address for the second read operation is directed to the same bitcell group and thus triggers the burst mode for the second memory clock cycle by asserting burst mode signal 145. In response to the assertion of burst mode signal 145, self-timed clock circuit 155 prevents the charging of the word line wl voltage during the second memory clock cycle. Similarly, self-timed clock circuit 155 prevents the sense node pre-charge signal from being asserted during the second memory clock cycle. In addition, self-timed clock circuit 155 also prevents a discharge of the gate voltage rm during the second memory clock cycle due to the burst mode operation. Column multiplexer 125 then selects for the second column through tri-state buffer 135 so that the bit from the second column's bitcell may be stored in data output latch 140.

To assist the latching within sense amplifier 110, the sense node pre-charge signal drives a gate of a PMOS transistor P5 having its source tied to a power supply node for the power supply voltage. The drain of transistor P5 connects to the sources of a pair of PMOS transistors P4 and P3. The drain of transistor P4 is tied to the sense node sl whereas the drain of transistor P3 is tied to the complement sense node slb. The output of NAND gate 115 drives the gate of transistor P4. Similarly, the output of NAND gate 120 drives the gate of transistor P3. For example, suppose that the output of NAND gate 115 is low. This low output switches on transistor P4 to reinforce the fully-charged state of sense node sl, which in turn reinforces the zero output for NAND gate 115. Conversely, suppose that the output of NAND gate 120 is low following a sense enable period. Transistor P3 would then be switched on. The switching on of transistor P3 reinforces the fully-charged state of complement sense node slb, which in turn reinforces the zero output of NAND gate 120. In this fashion, the latching of the sensed bit in sense amplifier 110 is strengthened or reinforced.

Figure 2:
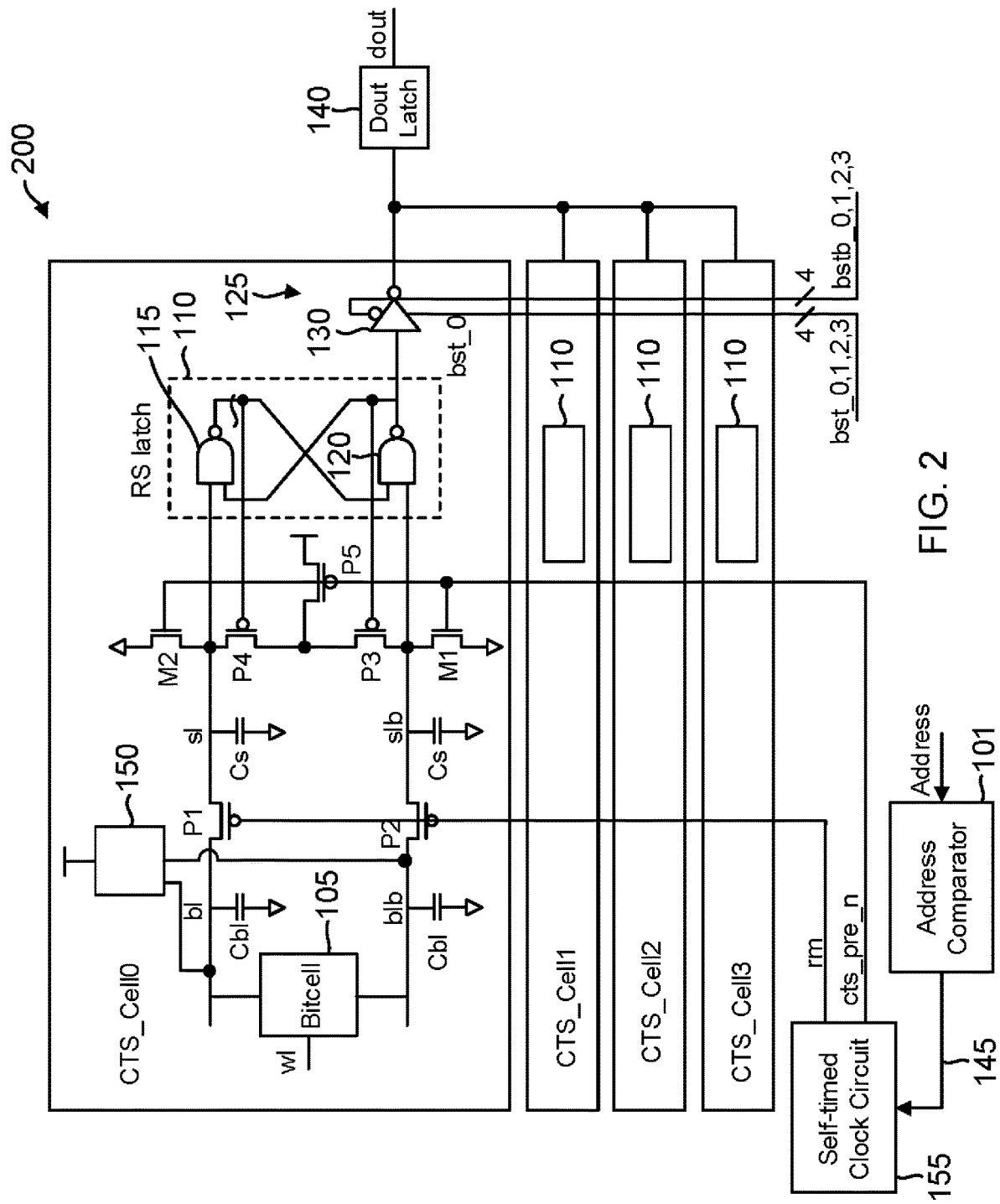
FIG. 2 illustrates a modification of the SRAM of FIG. 1 in which the column multiplexing is a 4:1 multiplexing in accordance with an aspect of the disclosure.

It will be appreciated that the burst mode operation disclosed herein is not limited to any particular column multiplexing size. For example, an SRAM 200 is shown in FIG. 2 in which four columns are multiplexed by a column multiplexer 125, ranging from a first column CTS_Cell0 to a fourth column CTS_Cell3. Each column has a bitcell at the column's intersection with word line wl. The structure within each column is as discussed with regard to SRAM 100. For illustration clarity, only first column CTS_Cell0 is shown in detail. Since there are four columns in the group of multiplexed columns that share data output latch 140, there are four decoded bits bst_0, bst_1, bst_2, and bst_3 as well as their complements that control which column is selected by column multiplexer 125. Column multiplexer 125 is implemented with tri-state buffers including tri-state buffer 130 as discussed with regard to memory 100 but it will be appreciated that other types of column multiplexers may be used in SRAM 200. The gate voltage rm controls the charge-transfer transistor in each column. Similarly, the sense node pre-charge signal (ctspre n) controls the precharging of the sense nodes through transistors M1 and M2 in each column as well as the latch reinforcement through transistors P3, P4, and P5 in each column as discussed with regard to SRAM 100.

Since there are four columns, just two bits (for example, two least-significant bits) will differ for each bitcell address in the bitcell group. During an initial non-burst-mode read operation, the discharge of the gate voltage rm may be performed by an inverter (not illustrated) in self-timed clock circuit 155. The inverter is relatively small so that the discharge of the gate voltage rm has some slew so that the amplification of the bit line voltage differences occurs with respect to the charge transfer to the corresponding sense nodes. Depending upon which column is addressed, the corresponding bit from the addressed bitcell is selected by column multiplexer 125 and latched into data output latch 140. However, sense amplifier 110 in each of the four columns latches its corresponding bit decision. If a subsequent read operation is directed to the same bitcell group, burst mode address comparator 101 activates the burst mode.

Figure 3:
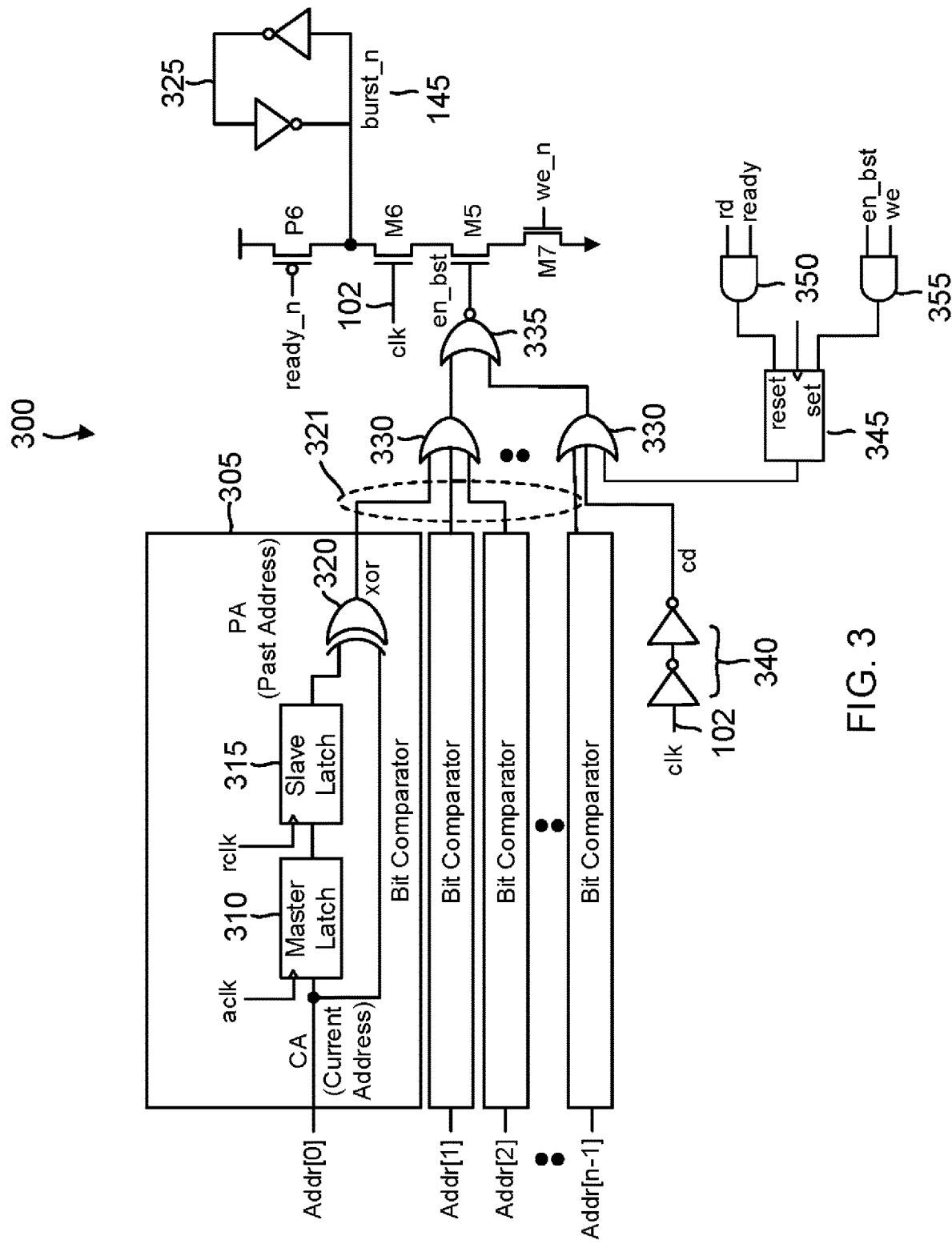
FIG. 3 is a circuit diagram for an example burst mode address comparator in accordance with an aspect of the disclosure.

An embodiment 300 for burst mode address comparator 101 is shown in more detail in FIG. 3. The row address is n bits wide ranging from a zeroth address bit Addr[0] to an (n−1)th address bit Addr[n−1]. Each address bit for a current memory cycle (both read and write) is compared to the corresponding bit for a preceding read cycle by a corresponding bit comparator 305. There is thus a bit comparator 305 for address bit Addr[0], a bit comparator 305 for address bit Addr[1], a bit comparator 305 for address bit Addr[2], and so on until a final bit comparator 305 is provided for the final address bit Addr[n−1]. Each bit comparator 305 forms a one-bit output signal having a binary state that depends on the corresponding bit comparison. Since there are n bit comparators 305 for the n-bit-wide read address, their one-bit output signals form an n-bit-wide bit comparison word 321.

Each bit comparator 305 includes a memory for storing its row address bit during a read operation. For example, the memory may be formed by a master latch 310 and a slave latch 315 that successively latch the corresponding bit from the read address. As used herein, the term "latch" refers to any suitable storage element that may either be synchronous (e.g., a register or flip-flop) or asynchronous (e.g. a reset-set latch). Each master latch 310 is clocked by a memory operation clock (aclk) that is asserted by a clock controller such as self-timed clock circuit 155 in response to the assertion of the memory clock signal 102. The memory clock signal 102 is asserted to begin either a read or a write operation. Each slave latch 315 is clocked by a read clock that is only asserted by the clock controller in response to an assertion of the memory clock signal for a read operation. The delay through the master and slave latching is one memory clock cycle so that the address bit stored by slave latch 315 is the address bit from the preceding read operation to the current cycle of the memory clock signal 102. Each bit comparator 305 also includes an XOR gate 320 that exclusively ORs the corresponding current address bit and the corresponding previous address bit from its slave latch 315. The one-bit output signal from each XOR gate 320 will thus be grounded if the current address bit and the corresponding previous address bit are the same. Note that this comparison is performed regardless of whether the current memory clock cycle is for a read operation or a write operation. N-bit wide comparison word 321 will thus be all zeroes if the current memory cycle is directed to the row as was addressed in the preceding read operation. The comparison word is thus an active-low signal that is asserted when the current row address equals the row address in the preceding read operation. In contrast, at least one of the bits in this N-bit wide comparison word will be charged to the memory power supply voltage if the current memory cycle is not directed to the same row address that was addressed in the preceding read operation. XOR gates 320 are an example of a first plurality of logic gates configured to assert the bit comparison word responsive to a current row address for the memory equaling the previous row address for a read operation.

A plurality of OR gates 330 arranged in parallel process the N-bit wide output signal formed by XOR gates 320. XOR gates 320 are arranged into XOR gate groups such that the output bits from each group of XOR gates 320 drive a corresponding one of OR gates 330. The input width of each OR gate 330 is three bits but this input width may be increased or decreased in alternative embodiments. A final OR gate 330 also ORs a delayed version of the memory clock signal 102 as delayed by an even number of inverters 340 to produce a delayed clock signal (cd). The delay between the delayed clock signal cd and the memory clock signal 102 controls the pulse width of an burst mode enable signal en_bst for the burst mode as will be explained further herein. A final OR gate 330 also processes an output signal from a reset-set burst mode blocking latch 345. In general, the goal is to enable the burst mode if a current read operation is directed to the same row as occurred in a preceding read operation when there has been no intervening write operation to the same row after the preceding read operation and before the current read operation.

Burst mode blocking latch 345 is only set in the case of the intervening write operation to the same row as will be explained further herein. The output signal from burst mode latch 345 is thus reset in the absence of the intervening write operation to the same row. If the current row address equals the preceding read operation's row address, the output signals from OR gates 330 will all be low during the delay period from the assertion of the memory clock signal 102 to the assertion of the delayed clock signal cd. The output signals from OR gates 330 will thus be all low during the delay period if stored row address and the current row address match.

The outputs of OR gates 330 are processed by a NOR gate 335 to form the burst mode enable signal en_bst. The burst mode enable signal en_bst thus will be high during the delay period if the current row address equals the row address for the preceding read cycle. In an alternative embodiment, OR gates 330 may be replaced by a single OR gate that processes the outputs from XOR gates 320, the delayed clock signal cd, and the output signal from burst mode latch 345. In such an embodiment, NOR gate 335 may be replaced by an inverter to produce the burst mode enable signal en_bst. The length of the delay period is determined by the delay through inverters 340. The burst mode enable signal en_bst drives a gate of an NMOS transistor M5 having a source connected to a drain of an NMOS transistor M7. The drain of transistor M7 connects to ground. An active-low write enable signal we_n drives the gate of transistor M7. The active-low write enable signal we_n is grounded during a memory clock cycle for a write operation and asserted to the power supply voltage during a memory clock cycle for a read operation. The drain for transistor M5 will thus be grounded during the delay period of a read operation in which the current row address matches the preceding read operation's row address. But even though the burst mode enable signal en_bst is asserted during a write operation in which the current row address matches the preceding read operation's row address, transistor M7 will be off to prevent transistor M5 from grounding its drain in response to the assertion of the burst mode enable signal en_bst. Transistor M7 may also be denoted as a first transistor whereas transistor M5 may be denoted as a second transistor.

The drain of transistor M5 connects to a source of an NMOS transistor M6, which may also be denoted as a third transistor. Since memory clock signal 102 drives the gate of transistor M6, a drain of transistor M6 will be grounded in response to a rising edge of memory clock signal 102 while the current row address matches the preceding row address for two consecutive read operations without any intervening write operation to the same row address. Once the delay period established by inverters 340 expires, the burst mode enable signal en_bst will go low to switch off transistor M5. The drain voltage of transistor M6 forms a burst mode node for burst mode signal 145. Burst mode signal 145 will thus be discharged to ground to signify that the burst mode is active if the current row address for a read operation matches the preceding read operation's row address without any intervening write operations to the same row address. A pulse latch 325 formed by a pair of inverters latches burst mode signal 145. In one embodiment, OR gates 330 and NOR gate 335 are an example of a second plurality of logic gates configured to switch on the first transistor (M5) to ground the burst mode node responsive to the assertion of the bit comparison word.

Burst mode signal 145 is re-evaluated for each consecutive read operation. Burst mode signal 145 should thus be reset by being charged to the memory power supply voltage before the next cycle of memory clock signal 102. For example, burst mode signal 145 may be reset by a PMOS transistor P6 having a drain connected to the drain of transistor M6. Transistor P6 may also be denoted as a fourth transistor. The source of transistor P6 is connected to a power supply node for the memory power supply voltage. If transistor P6 is switched on, the drain of transistor M6 and thus burst mode signal 145 will be charged to the memory power supply. A self-timed active-low ready signal (ready_n) such as produced by self-timed clock circuit 155 drives a gate of transistor P6 to control whether the burst mode signal 145 is reset. Self-timed clock circuit 155 may use a falling edge of the ready_n signal to trigger a release of the word line during a normal read operation. Although self-timed clock circuit 155 does not assert the word line during a burst mode operation, the falling edge of the ready_n signal is a convenient to control the reset of the burst mode signal 145. In alternative embodiments, other suitable signals such as the falling edge of memory clock signal 102 may be used to drive the gate of transistor P6 to control the reset of burst mode signal 145.

A first logic gate such as an AND gate 355 sets burst mode latch 345 when both the burst mode enable signal en_bst and a write enable signal (WE) are asserted. The write enable signal is asserted in each write operation. But the burst mode enable signal en_bst is only asserted when the row address for an intervening write operation is the same as the row address in the preceding random read operation. In that case, AND gate 355 asserts its output signal to set the burst mode latch 345. A subsequent read operation is then forced to be a random read operation even when the bit comparison word 321 is asserted due to a row address match because the output signal from final OR gate 330 is driven high by the setting of the burst mode latch 345. A second logic gate such as an AND gate 350 resets the burst mode latch 345 when both a read signal (rd) and a complement (ready) of the active-low ready signal ready_n are asserted. The read signal rd is asserted for each read operation. Similarly, the ready signal will be asserted after the word line assertion in a read operation. AND gate 350 will thus function to reset the burst mode latch 345 in each read operation, regardless of whether the read operation is a random read operation or a burst mode read operation.

Figure 4:
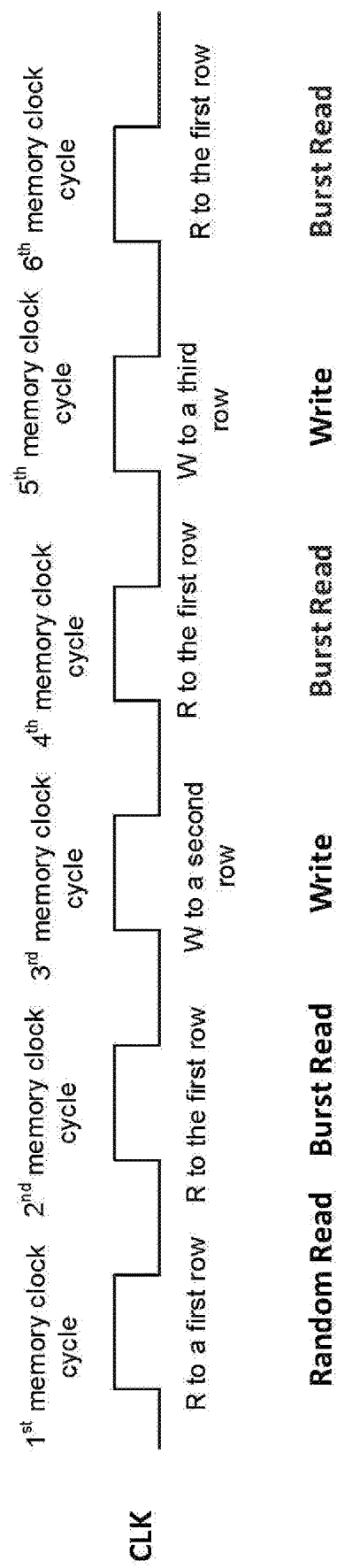
FIG. 4 is a timing diagram for various random and burst mode reads with intervening write operations in accordance with an aspect of the disclosure.

A timing diagram for a series of burst mode read operations and intervening write operations is shown in FIG. 4. The read and write operations are responsive to cycles of the memory clock signal (CLK). In an initial memory clock cycle, a random read (R) operation occurs to a first row. In a second memory clock cycle, the same first row is addressed in another read operation occurs to the first row so that the burst mode is invoked. A first write operation then occurs in a third memory clock cycle to a second row. Since this is not an intervening write operation to the first row, a read operation in a fourth memory clock cycle to the first row is again a burst mode read operation. A second write operation then occurs in a fifth memory clock cycle to a third row. Since this again is not an intervening write operation to the first row, a read operation in a sixth memory clock cycle to the first row is again a burst mode read operation.

Figure 5:
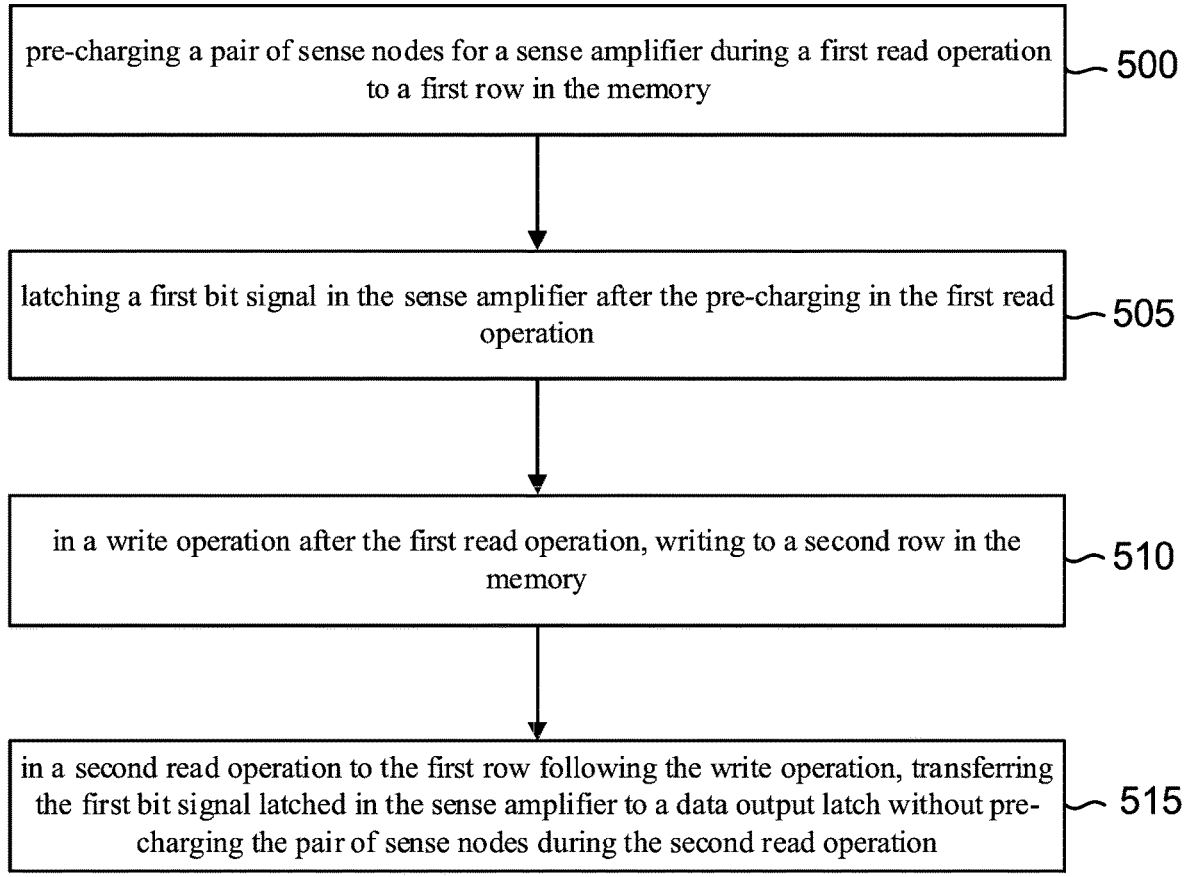
FIG. 5 is a flowchart of a burst mode address comparison method in which a burst mode occurs despite a presence of an intervening write operation in accordance with an aspect of the disclosure.

A method of burst mode address comparison will now be discussed with regard to the flowchart of FIG. 5. The method includes an act 500 of pre-charging a pair of sense nodes for a sense amplifier during a first read operation to a first row in the memory. The pre-charging of the sense nodes sl and slb in memories 100 or 200 is an example of act 500. The method further includes an act 505 of latching a first bit signal in the sense amplifier after the pre-charging in the first read operation. The latching of RS flip-flop 110 is an example of act 505. In addition, the method includes an act 510 that occurs in a write operation after the first read operation and includes writing to a second row of the memory. Either of the write operations discussed with regard to FIG. 4 is an example of act 510. Finally, the method includes an act 515 that occurs in a second read operation to the first row following the write operation and includes transferring the first bit signal latched in the sense amplifier to a data output latch without pre-charging the pair of sense nodes during the second read operation. The transfer of the bit latched in RS flip-flop 110 to the data output latch 140 during a burst mode read operation is an example of act 515.

Figure 6:
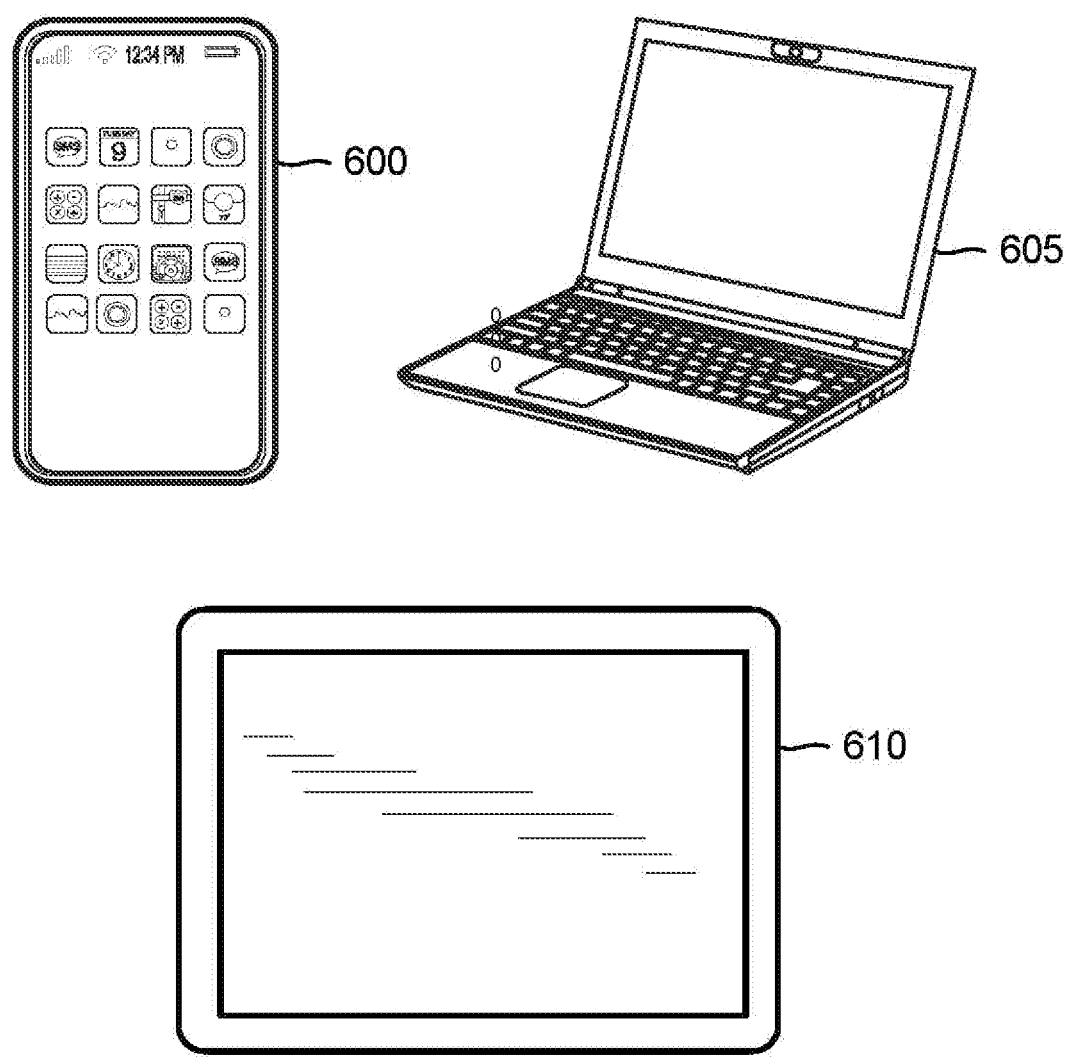
FIG. 6 illustrates some example electronic systems each incorporating an SRAM with burst mode address comparison in accordance with an aspect of the disclosure.

A memory with burst mode address comparison as disclosed herein may be incorporated into a wide variety of electronic systems. For example, as shown in FIG. 6, a cellular telephone 600, a laptop computer 605, and a tablet PC 610 may all include a memory having a burst mode address comparator in accordance with the disclosure. Other exemplary electronic systems such as a music player, a video player, a communication device, and a personal computer may also be configured with burst mode address comparators constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A burst mode address comparator for a memory, comprising:
    an address memory configured to store a first row address for a first read operation;
    a latch configured to set a latch output signal responsive to a second row address for a write operation following the first read operation being equal to the first row address;
    a first plurality of logic gates configured to assert a bit comparison word responsive to a current row address for the memory being equal to the first row address;
    a first transistor configured to switch off during each write operation and to switch on during each read operation;
    a second transistor having a first terminal coupled to a burst mode node for a burst mode signal and having a second terminal coupled to ground through the first transistor; and
    a second plurality of logic gates configured to switch on the second transistor to ground the burst mode node responsive to an assertion of the bit comparison word while the latch output signal is asserted and to not switch on the second transistor responsive to an assertion of the bit comparison word while the latch output signal is reset.

2. The memory of claim 1, further comprising:
    a third transistor coupled between the second terminal of the second transistor and the burst mode node, wherein the third transistor is configured to switch on responsive to a memory clock signal for the memory.

3. The memory of claim 1, wherein the address memory comprises a plurality of master-slave latches, and wherein each slave latch is responsive to a read clock signal.

4. The memory of claim 1, wherein the first plurality of logic gates comprises a plurality of XOR gates.

5. The memory of claim 4, wherein the second plurality of logic gates comprises:
    a plurality of OR gates configured to process the bit comparison word; and
    a NOR gate configured to process a plurality of output signals from the plurality of OR gates, wherein the NOR gate is further configured to drive a gate of the second transistor.

6. The memory of claim 5, wherein a final OR gate in the plurality of OR gates is further configured to process a delayed version of a memory clock signal for the memory and the latch output signal.

7. The memory of claim 2, further comprising:
    a self-timed clock circuit configured to assert a self-timed clock signal responsive to the memory clock signal; and
    a fourth transistor coupled between a power supply node for a memory power supply voltage and the burst mode node, wherein the fourth transistor is configured to switch on responsive to a falling edge of the self-timed clock signal.

8. The memory of claim 7, wherein the first transistor is an n-type metal-oxide semiconductor (NMOS) transistor, the second transistor is an NMOS transistor, the third transistor is an NMOS transistor, and the fourth transistor is a p-type metal-oxide (PMOS) transistor.

9. The memory of claim 1, further comprising;
    a first column including a first sense amplifier configured to sense a first bit from a first bitcell through a first pair of sense nodes to output the first bit at a first output terminal for the first column,
    a second column including a second sense amplifier configured to sense a second bit from a second bitcell through a second pair of sense nodes and to output the second bit at a second output terminal for the second column;
    a data output latch;
    a column multiplexer configured to select between the first bit from the first output terminal and the second bit from the second output terminal to provide a selected bit to the data output latch;
    a sense node pre-charge circuit configured to pre-charge the first pair of sense nodes and the second pair of sense nodes responsive to an assertion of a sense node pre-charge signal; and
    a self-timed clock circuit configured to assert the sense node pre-charge signal in read cycles in which the burst mode signal is not asserted.

10. The memory of claim 9, wherein the first sense amplifier comprises a first reset-set latch, and wherein the second amplifier comprises a second reset-set latch.

11. The memory of claim 9, wherein the first column includes a bit line coupled through a first charge-transfer transistor to the first sense node and further includes a complement bit line coupled through a second charge-transfer transistor to the second sense node, wherein the self-timed clock circuit is further configured to maintain the first charge-transfer transistor and the second charge-transfer transistor off in read cycles in which the burst mode signal is asserted.

12. The memory of claim 11, wherein the first charge-transfer transistor and the second charge-transfer transistor each comprises a PMOS transistor.

13. The memory of claim 5, further comprising:
a first logic gate configured to set the latch output signal responsive to an assertion of an output signal from the NOR gate while a write enable signal is asserted; and
a second logic gate configured to reset the output signal responsive to an assertion of a read enable signal.

14. The memory of claim 13, wherein the first logic gate and the second logic gate each comprises an AND gate.

15. The memory of claim 1, wherein the memory is incorporated in a cellular telephone.

16. A burst mode method for a memory, comprising:
pre-charging a pair of sense nodes for a sense amplifier during a first read operation to a first row in the memory:
latching a first bit signal in the sense amplifier after the pre-charging;
in a write operation after the first read operation, writing to a second row in the memory; and
in a second read operation to the first row following the write operation, transferring the first bit signal latched in the sense amplifier to a data output latch without pre-charging the pair of sense nodes during the second read operation.

17. The burst mode method of claim 16, further comprising:
asserting a word line during the first read operation; and
while the word line is asserted, initiating a charge-transfer period in which a first charge transfer from a first pre-charged bit line to a first sense node in the pair of sense nodes depends upon a binary value of a first bit, wherein the latching of the first bit signal is responsive to the first charge transfer, and wherein the word line is not asserted during the second read operation.

18. The burst mode method of claim 17, further comprising:
discharging the pair of sense nodes prior to the charge-transfer period.

19. The burst mode method of claim 16, wherein the pair of sense nodes are not pre-charged during the second read operation responsive to an assertion of a burst mode signal.

20. A memory, comprising:
a word line;
a plurality of columns, each column in the plurality of columns including a bitcell at an intersection of the column with the word line, a pair of bit lines, and a sense amplifier coupled to the pair of bit lines through a pair of sense nodes;
a burst mode blocking latch configured to set a latch output signal responsive to a write operation to a first row address after an initial read operation to the first row address;
a burst mode address comparator configured to determine for a series of subsequent read operations following the initial read operation whether each subsequent read operation is a burst mode read operation or a random read operation responsive to a row address for each subsequent read cycle and responsive to the latch output signal; and
a sense node pre-charge circuit configured to pre-charge each column's pair of sense nodes in each random read operation and to not pre-charge each column's pair of sense nodes in each burst mode read operation.

21. The memory of claim 20, further comprising:
a self-timed clock circuit, wherein the self-timed clock circuit is configured to assert the word line in each normal read operation and to not assert the word line in each burst mode read operation.

22. The memory of claim 20, wherein the burst mode blocking latch is further configured to reset the latch output signal in each random read operation and in each burst mode read operation.

* * * * *